(12) United States Patent
Nishiyama

(10) Patent No.: US 11,957,017 B2
(45) Date of Patent: Apr. 9, 2024

(54) DISPLAY DEVICE

(71) Applicant: Sharp Kabushiki Kaisha, Osaka (JP)

(72) Inventor: Takayuki Nishiyama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/765,601

(22) PCT Filed: Oct. 3, 2019

(86) PCT No.: PCT/JP2019/039177
§ 371 (c)(1),
(2) Date: Mar. 31, 2022

(87) PCT Pub. No.: WO2021/064954
PCT Pub. Date: Apr. 8, 2021

(65) Prior Publication Data
US 2022/0376026 A1    Nov. 24, 2022

(51) Int. Cl.
*H10K 59/131* (2023.01)
*G09G 3/20* (2006.01)
(Continued)

(52) U.S. Cl.
CPC ......... *H10K 59/131* (2023.02); *G09G 3/3233* (2013.01); *G09G 3/2003* (2013.01);
(Continued)

(58) Field of Classification Search
CPC .. H10K 59/131; H10K 59/35; H10K 59/1213; H10K 59/351; G09G 3/3233;
(Continued)

(56) References Cited

U.S. PATENT DOCUMENTS

2010/0053041 A1    3/2010  Abe et al.
2012/0327058 A1*  12/2012  Minami ............... G09G 3/3208
                                                              345/55
(Continued)

FOREIGN PATENT DOCUMENTS

JP    2010-060816 A    3/2010
JP    2013-003568 A    1/2013
JP    2018-200441 A    12/2018

OTHER PUBLICATIONS

Official Communication issued in International Patent Application No. PCT/JP2019/039177, dated Dec. 17, 2019.

*Primary Examiner* — Douglas M Wilson
(74) *Attorney, Agent, or Firm* — Keating & Bennett, LLP

(57) ABSTRACT

A display device includes, in a display area: scan control lines and data signal lines intersecting with each other; subpixels each including a subpixel circuit provided at an intersection of the scan control lines and the data signal lines; and light-emitting elements, one for each of the subpixels. The subpixel circuit includes a drive transistor, a write transistor, and a capacitor that retains a data signal. The write transistor includes a conduction terminal connected to an associated one of the data signal lines, another conduction terminal connected to a first gate terminal of the drive transistor, and a control terminal connected to an associated one of the scan control lines. Each of the light-emitting elements includes a first element electrode, a light-emitting layer, and a second element electrode, the first element electrode being connected to a conduction terminal of the drive transistor. The drive transistor includes a second gate terminal connected to the second element electrode via a contact hole.

12 Claims, 6 Drawing Sheets

(51) Int. Cl.
*G09G 3/3233* (2016.01)
*H01L 21/768* (2006.01)
*H01L 23/48* (2006.01)
*H01L 23/522* (2006.01)
*H01L 29/66* (2006.01)
*H01L 29/786* (2006.01)
*H10K 59/121* (2023.01)
*H10K 59/35* (2023.01)

(52) U.S. Cl.
CPC ............ *G09G 2300/0426* (2013.01); *G09G 2300/0819* (2013.01); *G09G 2300/0842* (2013.01); *G09G 2320/0223* (2013.01); *H01L 21/76805* (2013.01); *H01L 23/481* (2013.01); *H01L 23/5226* (2013.01); *H01L 29/66484* (2013.01); *H01L 29/78645* (2013.01); *H01L 2924/13085* (2013.01); *H10K 59/1213* (2023.02); *H10K 59/35* (2023.02); *H10K 59/351* (2023.02)

(58) Field of Classification Search
CPC ... G09G 2300/0426; G09G 2300/0819; G09G 2300/0842; G09G 2320/0223; G09G 3/2003; G09G 2300/0866; G09G 2300/088; G09F 9/30; H05B 33/02; H01L 29/66484; H01L 29/78645; H01L 2924/13085; H01L 21/76805; H01L 23/481; H01L 23/5226
See application file for complete search history.

(56) References Cited

U.S. PATENT DOCUMENTS

2018/0268760 A1* 9/2018 Chen .................... G09G 3/3266
2018/0342207 A1 11/2018 Tsuboi

* cited by examiner

DISPLAY DEVICE

TECHNICAL FIELD

The disclosure relates in general to display devices and in particular to active matrix display devices.

BACKGROUND ART

Products including an OLED (organic light-emitting diode) display device have been gaining popularity with advancement in OLED (organic light-emitting diode) technology. A typical OLED display device includes pixel circuits each of which feeds electric current to a pixel in a light-emitting layer. The pixel circuit includes a TFT (thin film transistor). The pixels are arranged in a matrix in the display device. The pixel circuit controls the light-emission luminance of the pixel (see, for example, Patent Literature 1).

CITATION LIST

Patent Literature

Patent Literature 1: Japanese Unexamined Patent Application Publication, Tokukai, No. 2018-200441

SUMMARY

Technical Problem

Patent Literature 1 describes a light-emitting device including a matrix of pixels each including a light-emitting element, a drive transistor, a write transistor, and an electrical potential setting section for setting an electrical potential on a node between the drive transistor and the light-emitting element. The electrical potential setting section setting an electrical potential on the node is an attempt to achieve high speed driving on the light-emitting device.

A voltage drop can occur along the wiring for the drive transistor, the light-emitting element, and other elements due to the inherent resistance of the wiring. The output luminance of the light-emitting element may therefore differ from the intended luminance, which is undesirable.

The disclosure has been made to address these issues and has an object to provide a display device capable of appropriately controlling the luminance of the light-emitting element.

Solution to Problem

The disclosure is directed to a display device including, in a display area, a matrix of: subpixels and light-emitting elements, one for each of the subpixels: wherein the subpixels each including a subpixel circuit provided at an intersection of scan control lines and data signal lines intersecting with the scan control lines, the subpixel circuit includes a drive transistor, a write transistor, and a capacitor that retains a data signal, the write transistor includes a conduction terminal connected to an associated one of the data signal lines, another conduction terminal connected to a first gate terminal of the drive transistor, and a control terminal connected to an associated one of the scan control lines, each of the light-emitting elements includes a first element electrode, a light-emitting layer, and a second element electrode, the first element electrode being connected to a conduction terminal of the drive transistor, and the drive transistor includes a second gate terminal connected to the second element electrode via a contact hole provided in the display area.

The display device in accordance with the disclosure may be configured so as to further include a back-gate electrode and a top-gate electrode, all of which are provided on a substrate in a stated order, wherein the back-gate electrode is the second gate terminal, and the top-gate electrode is the first gate terminal.

The display device in accordance with the disclosure may be configured such that the contact hole is provided at one of the subpixels.

The display device in accordance with the disclosure may be configured such that the contact hole is provided commonly to an associated plurality of subpixels.

The display device in accordance with the disclosure may be configured such that the plurality of subpixels includes at least three or more subpixels that emit light of different colors.

The display device in accordance with the disclosure may be configured such that the plurality of subpixels includes a first subpixel that emits light of a first color and a second subpixel that emits light of a second color that differs from the first color, and $g_{ld1} > g_{ld2}$ and $g_{m1} > g_{m2}$, where $g_{ld1}$ is a conductance of one of the light-emitting elements in the first subpixel, $g_{m1}$ is a mutual conductance of the first subpixel, $g_{ld2}$ is a conductance of one of the light-emitting elements in the second subpixel, and $g_{m2}$ is a mutual conductance of the second subpixel.

The display device in accordance with the disclosure may be configured such that the plurality of subpixels includes a first subpixel that emits light of a first color and a second subpixel that emits light of a second color that differs from the first color, and $g_{ld1} > g_{ld2}$ and $k_1 > k_2$, where $g_{ld1}$ is a conductance of one of the light-emitting elements in the first subpixel, $k_1$ is a capacitance ratio of the first subpixel, $g_{ld2}$ is a conductance of one of the light-emitting elements in the second subpixel, and $k_2$ is a capacitance ratio of the second subpixel.

The display device in accordance with the disclosure may be configured such that the capacitor includes a terminal connected to the second element electrode via the contact hole provided in the display area.

The display device in accordance with the disclosure may be configured such that the drive transistor contains an oxide semiconductor layer.

Advantageous Effects of Disclosure

In the disclosure, the electrical potential on the second element electrode of the light-emitting element is fed to the second gate terminal of the drive transistor. This arrangement can reduce changes in the luminance of the light-emitting element caused by a voltage drop on the second element electrode, thereby appropriately controlling the luminance.

DESCRIPTION OF EMBODIMENTS

The following will describe a display device in accordance with an embodiment of the disclosure with reference to drawings.

Figure 1:
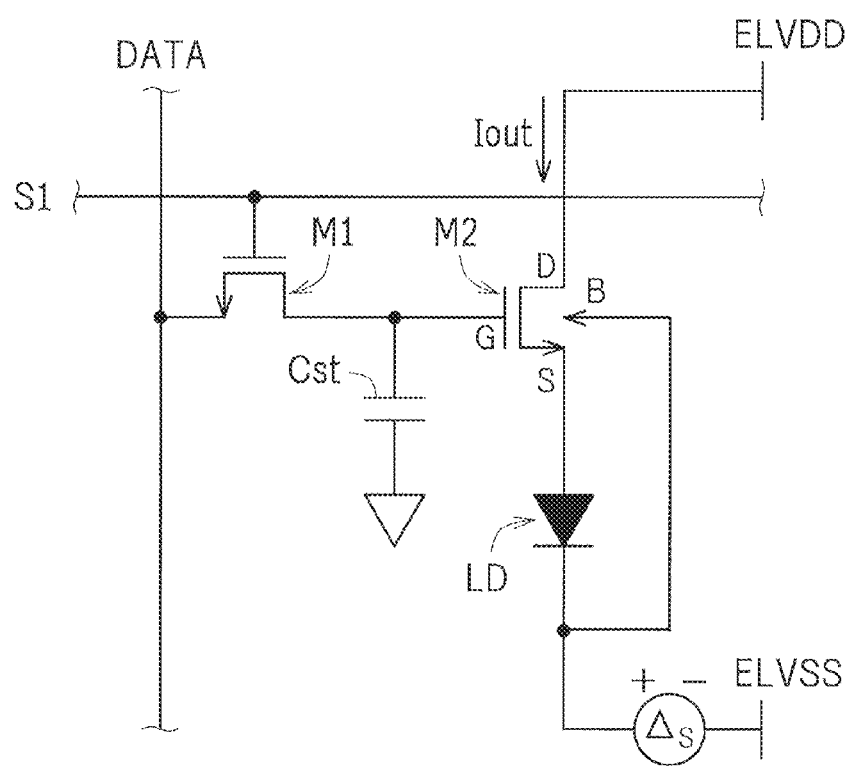
FIG. 1 is a circuit diagram of a pixel circuit in a display device.

FIG. 1 is a circuit diagram of a subpixel circuit in the display device.

The display device has a display area including a matrix of subpixels. The subpixels typically include red pixels (corresponding to red light-emitting layer 13R in FIG. 5) to display red colors, green pixels (corresponding to green light-emitting layer 13G in FIG. 5) to display green colors, and blue pixels (corresponding to blue light-emitting layer 13B in FIG. 5) to display blue colors. Each pixel includes a light-emitting diode LD that is controlled by an associated subpixel circuit.

"S1" denotes a scan control line, and "DATA" denotes a data signal line. "ELVDD" denotes a high-voltage power supply and a high-voltage power supply line, and "ELVSS" denotes a low-voltage power supply and a low-voltage power supply line.

FIG. 1 shows an example of the subpixel circuit including a combination of two transistors (a write transistor M1 and a drive transistor M2), a capacitor Cst, and a light-emitting element LD.

The drive transistor M2 is a double gate transistor and has a top gate (first gate terminal; indicated by "G" in FIG. 1) at which a data voltage (data signal) is inputted and a back gate (second gate terminal; indicated by "B" in FIG. 1) opposite the top gate. The structure of the drive transistor M2 will be described later in detail with reference to FIG. 4.

The drive transistor M2 has one of the conduction terminals thereof (drain; indicated by "D" in FIG. 1) connected to the high-voltage power supply line and the other conduction terminal (source; indicated by "S" in FIG. 1) connected to the anode of the light-emitting element LD.

The write transistor M1 has one of the conduction terminals thereof (shown in the left side in FIG. 1) connected to the data signal line, the other conduction terminal thereof (shown in the right side in FIG. 1) connected to the top gate of the drive transistor M2, and the control terminal thereof (shown on the top side of M1 in FIG. 1) connected to the scan control line.

The capacitor Cst has a first terminal thereof connected to a line linking the other conduction terminal of the write transistor M1 and the top gate of the drive transistor M2. The capacitor Cst has a second terminal thereof connected to, for example, the ground. The second terminal of the capacitor Cst is not necessarily grounded and may be otherwise connected. Variation examples will be described in detail in which the second terminal of the capacitor Cst is connected to a different site.

The light-emitting element LD has the anode thereof (corresponding to a first element electrode 12a, detailed later) connected to the source of the drive transistor M2 and the cathode thereof (corresponding to a second element electrode 15, detailed later) connected to the low-voltage power supply line and further to the back gate of the drive transistor M2 so that the cathode output can be fed to the back gate.

The wiring in the subpixel circuit has inherent resistance that can cause a voltage drop. FIG. 1 indicates the voltage drop attributed to the resistance of the wiring that leads to the low-voltage power supply line by $\Delta_S$. Letting ELVDD represent the electrical potential input from the high-voltage power supply line and ELVSS represent the electrical potential output from the low-voltage power supply line in the subpixel circuit, the electrical potential on the cathode of the light-emitting element LD is equal to ELVSS+$\Delta_S$, which counts in the rise equivalent to the voltage drop caused by the resistance. FIG. 1 indicates, by Iout, the electric current that flows when the drain-source channel of the drive transistor M2 conducts.

In this subpixel circuit, the drive transistor M2 is under a back gate bias $V_{BS}$ that satisfies the relation: $V_{BS}=V_B-V_S=-V_{LD}$, where $V_B$ is the electrical potential on the back gate of the drive transistor M2, $V_S$ is the electrical potential on the source of the drive transistor M2, and $V_{LD}$ is the voltage applied to the light-emitting element LD.

A description is given next of an equivalent circuit of the subpixel circuit shown in FIG. 1 in relation to a feedback system in which the electrical potential on the cathode of the light-emitting element LD is fed to the back gate of the drive transistor M2.

Figure 2:
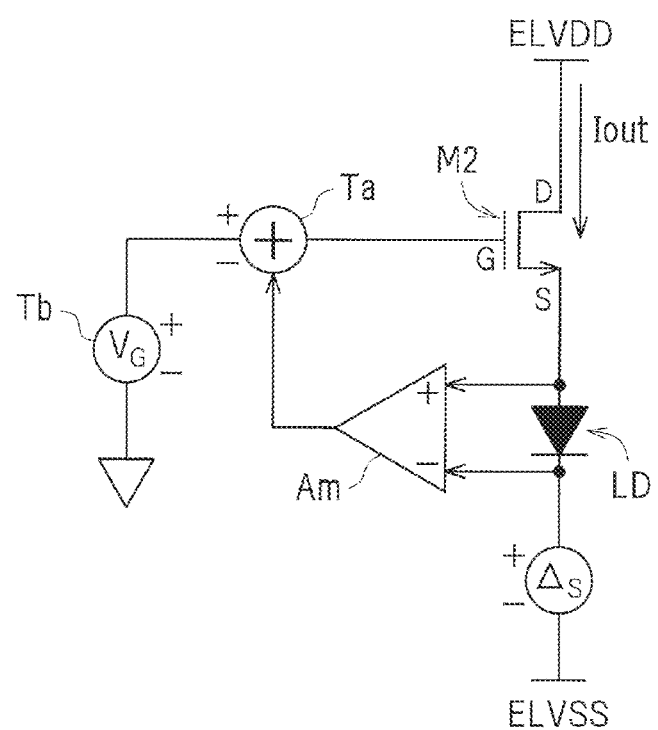
FIG. 2 is a circuit diagram of an equivalent circuit of the pixel circuit shown in FIG. 1.

FIG. 2 is a circuit diagram of an equivalent circuit of the subpixel circuit shown in FIG. 1.

The circuit diagram in FIG. 2 selectively shows major parts of the subpixel circuit in FIG. 1, omitting the other parts, by focusing on the interaction between the drive transistor M2 and the light-emitting element LD. The drive transistor M2 and the light-emitting element LD are connected between the high-voltage power supply line and the low-voltage power supply line in the same order as in FIG. 1. The output from the cathode of the light-emitting element LD is fed to the gate of the drive transistor M2, not to the back gate of the drive transistor M2, in FIG. 2 when compared with FIG. 1. The equivalent circuit in FIG. 2 is essentially the same as the subpixel circuit shown in FIG. 1, only redrawn in another form for the purpose of description; not all the parts of the equivalent circuit are physically present in the subpixel circuit.

Specifically, the equivalent circuit includes an operational amplifier Am fed with the output from a node between the source of the drive transistor M2 and the anode of the light-emitting element LD and with the output from the cathode of the light-emitting element LD. The output of the operational amplifier Am is fed to a feedback terminal Ta. The gate of the drive transistor M2 is connected to the feedback terminal Ta. The feedback terminal Ta is grounded via a gate signal terminal Tb. The electrical potential that varies on the gate signal terminal Tb is denoted by $V_G$ in the equivalent circuit.

A description is given next of the influence on the subpixel circuit of the electrical potential on the cathode of the light-emitting element LD being fed to the back gate of the drive transistor M2. The voltage drop $\Delta_S$ described above varies depending on where the subpixel circuit is located in the display area and when a measurement is made. When this $\Delta_s$, hence the electrical potential on the source of the drive transistor M2, increases, the gate-to-source voltage $V_{GS}$ of the drive transistor M2 decreases, which lowers the drive capability of the drive transistor M2. $V_{LD}$ then decreases with the decreased current-drive capability of the drive transistor M2 in accordance with Kirchhoff's first law.

As indicated by the equation described above, however, decreasing $V_{LD}$ causes an increase in $V_{BS}$, which in turn increases the current-drive capability of the drive transistor M2 (negative feedback). This feedback path lowers the sensitivity of Iout to $\Delta_S$, thereby reducing changes in the luminance caused by a voltage drop on the cathode.

A double gate transistor is driven by the voltage applied to one of the gates. The threshold voltage, $V_{th}$, for one of the gates of the transistor is controllable by applying a voltage to the other gate. Letting $V_{th2}$ represent the threshold voltage of the transistor controlled through the back gate, the following equation hold:

$$V_{th2}=V_{th}-k \times V_{BS}.$$

Figure 4:
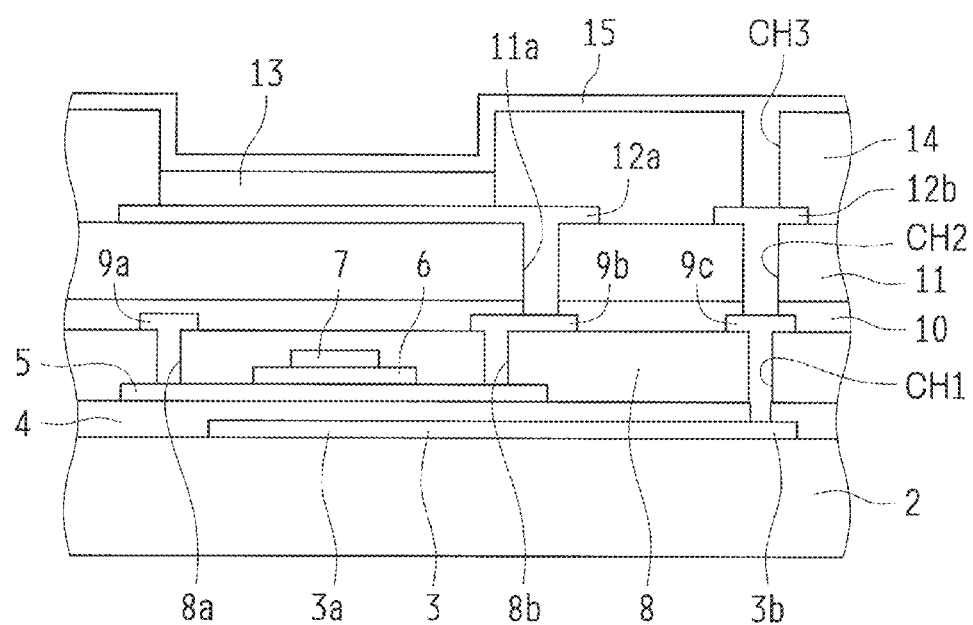
FIG. 4 is a schematic cross-sectional view of a drive transistor, a light-emitting element, and a vicinity thereof in a display device in accordance with an embodiment of the disclosure.

In this equation, k corresponds to a top-to-bottom capacitance ratio and defined as being equal to the back-gate capacitance divided by the drive-gate capacitance. In FIG. 4 (described later in detail), the capacitance between a back-gate electrode 3 and an oxide semiconductor layer 5 corresponds to the back-gate capacitance, and the capacitance between the oxide semiconductor layer 5 and a top-gate electrode 7 corresponds to the drive-gate capacitance, in top gate drive where the data signal is fed to the top gate as in the present embodiment. As can be understood from the relation described above, an increase in the back-gate capacitance causes an increase in the amount of change, $\Delta V_{th}$, between $V_{th}$ and $V_{th2}$, thereby increasing the s value.

The following equation holds for the back gate voltage when a contact hole is provided inside the display area, that is, near the associated light-emitting element:

$$V_B = ELVSS + \Delta_S.$$

Taking into account that $V_G$, $V_{th}$, and ELVSS are independent of $\Delta_S$, the sensitivity to the variation of the cathode electrical potential in the equivalent circuit shown in FIG. 2 is given by $$\partial Iout/\partial \Delta_S = -(g_m g_{ld})/(g_{ld}+(1+k)g_m).$$

Figure 3:
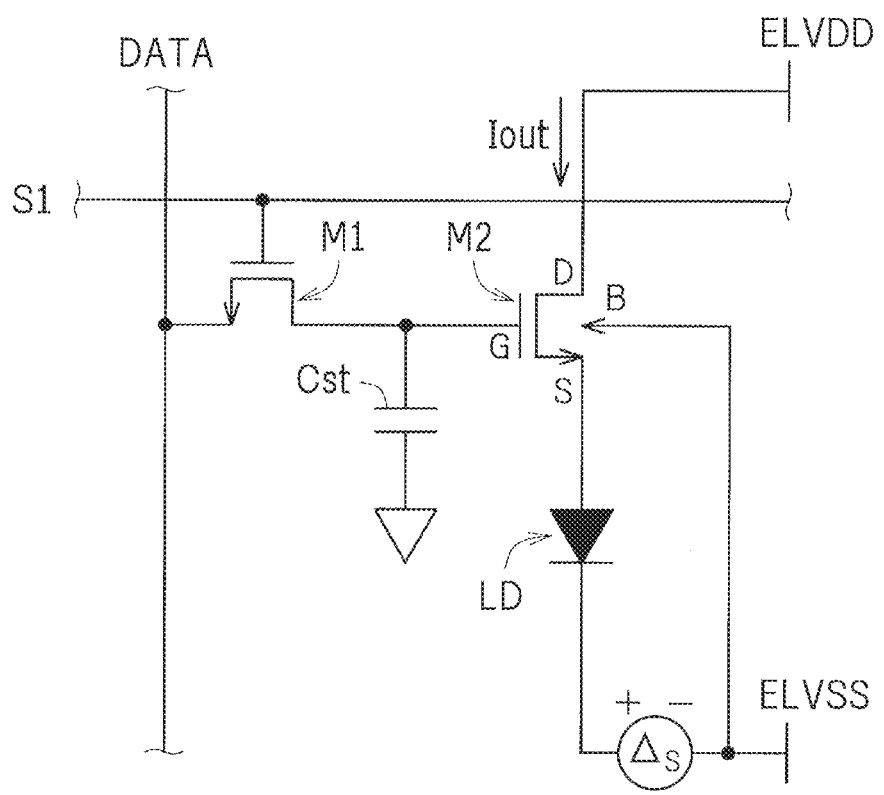
FIG. 3 is a circuit diagram of a pixel circuit in accordance with a comparative example in which the input source for a back gate is changed.

A comparative example is now described where the cathode electrical potential outside the display area is fed to the back gate in the circuit shown in FIG. 1 (see FIG. 3). This comparative example in FIG. 3 has, outside the display area, a contact hole that connects to the cathode, so that the cathode electrical potential can be fed to the back gate by running a wire in the contact hole. The electrical potential on the back gate in the comparative example is given by, $$V_B = ELVSS.$$

The sensitivity to the variation of the cathode electrical potential in the comparative example therefore is given by the following equation:

$$\partial Iout/\partial \Delta_S = -(1+k)(g_m g_{ld})/(g_{ld}+(1+k)g_m),$$

which indicates that the amount of change of the luminance is increased.

Figure 5:
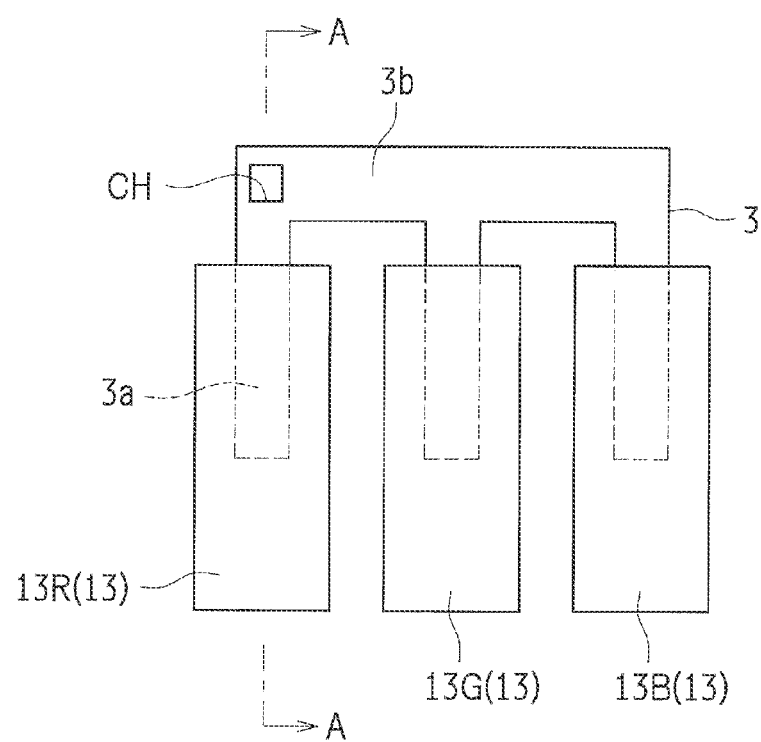
FIG. 5 is a schematic plan view of a light-emitting element and a vicinity thereof in a display device in accordance with an embodiment of the disclosure.

The electrical potential on the cathode near the associated light-emitting element is preferably fed back to the back-gate electrode in this manner. The "electrical potential on the cathode near the light-emitting element" refers to the electrical potential on the cathode not more than 100 pixels from the light-emitting element (in other words, there exists a common contact hole at or within 100 pixels), where a set of a R, a G, and a B subpixel in a stripe RGB pattern is counted as one pixel. More preferably, the electrical potential on the cathode not more than 10 pixels therefrom is fed back to the back-gate electrode. FIG. 5, which will be described later in detail, shows the electrical potential on the cathode not more than 1 pixel therefrom being fed back to the back-gate electrode. The subpixels are not necessarily arranged in a stripe RGB pattern and may include a different number of light-emitting elements of any particular color from the number of light-emitting elements of the other colors as in a diamond RGGB pattern.

In the above-described equation, k corresponds to the amplification factor of the operational amplifier Am and is the above-described top-to-bottom capacitance ratio. The mutual conductance $g_m$ is a derivative of the drain current $I_D$ with respect to the gate-to-source voltage $V_{GS}$ and is a function, $g_m$ ($V_{GS}$), of $V_{GS}$ The symbol $g_{ld}$ denotes the conductance of the light-emitting element LD. The above-described equation shows that the amount of change of the luminance with respect to the variation of the cathode electrical potential is smaller when the back gate control is implemented (k>0) than when no back gate control is implemented (k=0).

When $I_D$=100 nA, $g_m$=1.3×10$^{-7}$ in the present embodiment. In addition, $g_{ld}$ of the light-emitting element in a red pixel (abbreviated $g_r$) is equal to 9.3×10$^{-8}$, $g_{ld}$ of the light-emitting element in a green pixel (abbreviated $g_g$) is equal to 1.1×10$^{-7}$, and $g_{ld}$ of the light-emitting element in a blue pixel (abbreviated $g_b$) is equal to 1.8×10$^{-7}$. These values show that $g_m$ is approximately equal to $g_{ld}$, $g_{ld}$ differs for each color, and the amount of change of the luminance increases with a larger $g_{ld}$. The inequality, $g_b > g_g > g_r$, holds with the amount of change being largest in the blue luminance, in this example.

FIG. 4 is a schematic cross-sectional view of a drive transistor, a light-emitting element, and a vicinity thereof in a display device in accordance with an embodiment of the disclosure. FIG. 5 is a schematic plan view of a light-emitting element and a vicinity thereof in a display device in accordance with an embodiment of the disclosure. FIG. 4 is a cross-sectional view taken along line A-A in FIG. 5. FIG. 5 selectively shows, among other members, a light-emitting layer 13 and the back-gate electrode 3 and also shows some members including an interlayer insulation film as being transparent, for the sake of clarity of the drawing.

The display device includes the back-gate electrode 3, a back-gate insulation film 4, the oxide semiconductor layer 5, a top-gate insulation film 6, the top-gate electrode 7, an intermediate insulation film 8, first layer electrodes (drain electrode 9a, source electrode 9b, and first contact electrode 9c), a passivation film 10, a planarization film 11, second layer electrodes (first element electrode 12a and second contact electrode 12b), the light-emitting layer 13, an edge cover layer 14, and the second element electrode 15, all of which are provided on a substrate 2 in the stated order.

Referring to FIG. 5, the light-emitting layer 13 is divided into insular regions separated from each other. FIG. 5 shows that there are provided three regions: the red light-emitting layer 13R, the green light-emitting layer 13G, and the blue light-emitting layer 13B.

The substrate 2 may be, for example, a glass substrate, a silicon substrate, or a heat-resistant plastic substrate (resin substrate). The plastic substrate (resin substrate) may be made of, for example, a polyethylene terephthalate (PET), a polyethylene naphthalate (PEN), a polyethersulfone (PES), an acrylic resin, or a polyimide. The substrate 2 may have any thickness and may be a thin film.

The back-gate electrode 3 is a metal film formed by sputtering. The back-gate electrode 3 may be, for example, a film of a metal element selected from aluminum (Al), tungsten (W), molybdenum (Mo), tantalum (Ta), chromium (Cr), titanium (Ti), and copper (Cu), a film of an alloy of any combination of these elements, or a stack of any of these films. The back-gate electrode 3 lies below the light-emitting layer 13 and includes: transistor sections 3a opposite the oxide semiconductor layer 5 across the back-gate insulation film 4; and a contact section 3b removed from the light-emitting layer 13 and overlapping a contact hole CH. The back-gate electrode 3 may be formed in an appropriate manner by patterning involving a publicly known photolithography process. As shown in FIG. 5, there extend three transistor sections 3a from the single contact section 3b. The transistor sections 3a are provided below the red light-emitting layer 13R, the green light-emitting layer 13G, and the blue light-emitting layer 13B respectively.

The back-gate insulation film 4 is formed of $SiO_2$ by CVD. The back-gate insulation film 4 is not necessarily limited to this example and may be made of, for example, a silicon oxide ($SiO_x$), a silicon nitride ($SiN_x$), a silicon oxynitride ($SiO_xN_y$, where x>y), a silicon nitroxide ($SiN_xO_y$, where x>y), an aluminum oxide, or a tantalum oxide and may be a stack of layers.

The oxide semiconductor layer 5 is an In—Ga—Zn—O-based semiconductor film formed in an appropriate manner by, for example, sputtering and patterning involving a publicly known photolithography process. The oxide semiconductor layer 5 may be divided into insular regions separated from each other, similarly to the light-emitting layer 13, in such a manner that the three regions reside in locations corresponding to the red light-emitting layer 13R, the green light-emitting layer 13G, and the blue light-emitting layer 13B respectively.

The top-gate insulation film 6 is formed of the same material and by the same method as the back-gate insulation film 4 and may be formed in an appropriate manner by patterning involving a publicly known photolithography process. The top-gate insulation film 6 is provided so as to overlap a part of the oxide semiconductor layer 5 with the other parts of the oxide semiconductor layer 5 being exposed.

The top-gate electrode 7 is a metal film formed of the same material and by the same method as the back-gate electrode 3 and may be formed in an appropriate manner by patterning involving a publicly known photolithography process. The top-gate electrode 7 is provided so as to overlap the top-gate insulation film 6.

The top-gate electrode 7 covers a part of the top-gate insulation film 6 with the other parts of the top-gate insulation film 6 being exposed in the structure shown in FIG. 4. Alternatively, the top-gate electrode 7 may cover the entire top-gate insulation film 6. When this is the case, the top-gate electrode 7 and the top-gate insulation film 6 may be successively etched using the same photoresist mask that is used in the photolithographic patterning. The top-gate electrode 7 and the top-gate insulation film 6 are patterned into matching shapes and share the same shape. The top-gate electrode 7 and the top-gate insulation film 6, patterned into matching shapes in this manner, are self-aligned. This technique streamlines manufacturing steps and is still capable of precisely aligning the top-gate electrode 7 and the top-gate insulation film 6. These matching shapes do not need to be strictly the same and allow for a dimensional discrepancy of approximately a few micrometers caused by, for example, different etching rates.

The top-gate electrode 7 and the top-gate insulation film 6 are provided correspondingly in a plurality of regions of the oxide semiconductor layer 5, and when the three, red, green and blue light-emitting layers 13R, 13G, and 13B are provided, in three locations corresponding respectively to the three, red, green and blue light-emitting layers 13R, 13G, and 13B.

The intermediate insulation film 8 is formed of the same material and by the same method as the back-gate insulation film 4. The intermediate insulation film 8 is provided so as to cover the exposed top faces of the back-gate insulation film 4, the oxide semiconductor layer 5, the top-gate insulation film 6, and the top-gate electrode 7.

The first layer electrodes (drain electrode 9a, source electrode 9b, and first contact electrode 9c) are metal films formed of the same material and by the same method as the back-gate electrode 3 and may be formed in an appropriate manner by patterning involving a publicly known photolithography process. A drain contact hole 8a, a source contact hole 8b, and a first contact hole CH1 are formed through the corresponding parts of the back-gate insulation film 4 and the intermediate insulation film 8 before the first layer electrodes are formed.

The drain electrode 9a is provided so as to overlap those parts of the oxide semiconductor layer 5 which are not covered by the top-gate electrode 7 and the top-gate insulation film 6 in a plan view. The drain electrode 9a is electrically connected to the oxide semiconductor layer 5 via the drain contact hole 8a.

The source electrode 9b is provided so as to overlap those parts of the oxide semiconductor layer 5 which are not covered by the top-gate electrode 7 and the top-gate insulation film 6 in a plan view. The source electrode 9b is electrically connected to the oxide semiconductor layer 5 via the source contact hole 8b.

That part of the oxide semiconductor layer 5 which is connected to the drain electrode 9a (drain region) is located opposite the part thereof which is connected to the source electrode 9b (source region) across the part thereof which is covered by the top-gate electrode 7 and the top-gate insulation film 6 (channel region). The oxide semiconductor layer 5, thus formed, serves as the drive transistor M2 described above.

The first contact electrode 9c is provided so as to overlap the contact section 3b of the back-gate electrode 3 and electrically connected to the back-gate electrode 3 via the first contact hole CH1.

The passivation film 10 is formed of the same material and by the same method as the back-gate insulation film 4. The planarization film 11 is formed of a resin such as a polyimide resin or an acrylic resin. The passivation film 10 and the planarization film 11 may be formed of the same material or different materials.

The second layer electrodes (first element electrode 12a and second contact electrode 12b) are metal films formed of the same material and by the same method as the back-gate electrode 3 and may be formed in an appropriate manner by patterning involving a publicly known photolithography process. An element contact hole CH and a second contact hole CH2 are formed through the corresponding parts of the passivation film 10 and the planarization film 11 before the second layer electrodes are formed.

The first element electrode 12a is provided so as to overlap the oxide semiconductor layer 5 and the source electrode 9b in a plan view and electrically connected to the source electrode 9b via the element contact hole CH.

The second contact electrode 12b is provided so as to overlap the first contact electrode 9c and electrically connected to the first contact electrode 9c via the second contact hole CH2.

The light-emitting layer 13 is provided in a region overlapping the first element electrode 12a. The light-emitting layer 13 is made of, for example, an organic compound and may be a stack of layers. The light-emitting layer 13 may, for example, be made of other materials in an appropriate manner to adjust the color of emission in an appropriate manner.

FIGS. 4 and 5 show the first element electrode 12a and the light-emitting layer 13 overlapping the oxide semiconductor layer 5. Alternatively, the light-emitting layer 13 may be separated from the oxide semiconductor layer 5 so long as the first element electrode 12a is electrically connected to the source electrode 9b.

The edge cover layer 14 is provided so as to cover other than the light-emitting layer 13. The second element electrode 15 is provided so as to cover the entirety of the display area and electrically connected to the exposed light-emitting layer 13. In other words, the second element electrode 15 is provided commonly to the red light-emitting layer 13R, the green light-emitting layer 13G, and the blue light-emitting layer 13B. A third contact hole CH3 is formed through that part of the edge cover layer 14 which corresponds to the second contact electrode 12b, so that the second contact electrode 12b can be electrically connected to the second element electrode 15 via the third contact hole CH3.

The first element electrode 12a is preferably made of an opaque material, so that the first element electrode 12a can reflect light. The second element electrode 15 is transparent and is made of, for example, ITO. The light-emitting element LD described above is a combination of the first element electrode 12a, the light-emitting layer 13, and the second element electrode 15. The light-emitting layer 13 emits light that travels through the second element electrode 15 and reaches the outside. The first element electrode 12a preferably reflects the light emitted by the light-emitting layer 13, so that the light does not leak downwards.

The first contact hole CH1, the second contact hole CH2, and the third contact hole CH3 serve as the contact hole CH for connecting the back-gate electrode 3 and the second element electrode 15 as described earlier.

The contact hole CH is preferably provided inside an associated subpixel. The provision of the contact hole CH inside an associated subpixel can therefore reduce the amount of change in the luminance. The contact hole CH is preferably shared by a plurality of subpixels. This structure can reduce the number of contact holes CH.

FIG. 4 shows the back-gate electrode 3 overlapping the source electrode 9b. FIG. 4 is however drawn to illustrate electrical connection, and in practice, the back-gate electrode 3 preferably does not overlap the drain electrode 9a and the source electrode 9b to reduce parasitic capacitance. The back-gate electrode 3 needs only to overlap at least the channel region of the oxide semiconductor layer 5. If the back-gate electrode 3 overlaps the conductive regions of the oxide semiconductor layer 5 (any regions other than the channel region; for example, the drain region and the source region), the parasitic capacitance increases accordingly.

The oxide semiconductor layer 5 is not necessarily formed of the above-described material and may be formed of another material. The oxide semiconductor layer 5 may contain an oxide semiconductor that is, for example, either an amorphous oxide semiconductor or a crystalline (partially crystalline) oxide semiconductor. Examples of the crystalline oxide semiconductor include polycrystalline oxide semiconductors, microcrystal oxide semiconductors, and crystalline oxide semiconductors with a c-axis substantially normal to the layer plane.

The oxide semiconductor layer 5 may have a layered structure including two or more layers, in which case the oxide semiconductor layer 5 may include both an amorphous oxide semiconductor layer and a crystalline oxide semiconductor layer, a plurality of crystalline oxide semiconductor layers of different crystalline structures, or a plurality of amorphous oxide semiconductor layers.

A detailed description is given next of, for example, the material and structure of the amorphous oxide semiconductor and the crystalline oxide semiconductor. The oxide semiconductor layer 5 may contain, for example, at least one of metal elements of In, Ga, and Zn and is, in the present embodiment, an In—Ga—Zn—O-based semiconductor (e.g., indium gallium zinc oxide). The In—Ga—Zn—O-based semiconductor is a ternary oxide of In (indium), Ga (gallium), and Zn (zinc) and may have any In, Ga, and Zn ratio (composition ratio), for example, In:Ga:Zn=2:2:1, In:Ga:Zn=1:1:1, or In:Ga:Zn=1:1:2. The In—Ga—Zn—O-based semiconductor may be either amorphous or crystalline. The In—Ga—Zn—O-based crystalline semiconductor is preferably an In—Ga—Zn—O-based crystalline semiconductor with a c-axis substantially normal to the layer plane.

The oxide semiconductor layer 5 may contain an oxide semiconductor other than an In—Ga—Zn—O-based semiconductor and may contain, for example, an In—Sn—Zn—O-based semiconductor. The In—Sn—Zn—O-based semiconductor is a ternary oxide of In, Sn (tin), and Zn and may be, for example, $In_2O_3$—$SnO_2$—$ZnO$ (InSnZnO).

The oxide semiconductor layer 5 may alternatively contain, for example, an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, an $InGaO_3(ZnO)_5$, a magnesium zinc oxide ($Mg_XZn_{1-X}O$), or a cadmium zinc oxide ($Cd_XZn_{1-X}O$). The Zn—O-based semiconductor may be amorphous ZnO, polycrystalline ZnO, or microcrystal ZnO in which amorphous ZnO and polycrystalline ZnO coexist, either with at least one of impurities of a Group 1 element, a Group 13 element, a Group 14 element, a Group 15 element, and a Group 17 element or without any impurities at all.

The present embodiment has been described assuming that the transistor is top gate driven where a data signal is fed to the top gate. Alternatively, the transistor may be back gate driven where a data signal is fed to the back gate.

The display device is not necessarily structured as described above. The structure may be modified as in Variation Example 1 to Variation Example 3 described below.

Variation Example 1

In the foregoing examples, while $g_{1d}$ is varied with color, $g_m$ is a constant. In contrast, $g_m$ is varied with color to further reduce changes in the luminance in Variation Example 1. As described earlier, when $g_b > g_g > g_r$, it is only required that $g_m b$ ($g_m$ for the blue pixel) > $g_m g$ ($g_m$ for the green pixel) > $g_m r$ ($g_m$ for the red pixel). Specifically, for example, it is only required that channel length (blue pixel) < channel length (green pixel)<channel length (red pixel) or that channel length (blue pixel)>channel length (green pixel)>channel length (red pixel).

Variation Example 2

In Variation Example 1, $g_m$ is varied with color. Instead, k is varied with color to further reduce changes in the luminance in Variation Example 2. The magnitude of k may be matched with the magnitude of $g_{ld}$. When $g_b>g_g>g_r$, it is only required that $k_b$ (k for the blue pixel)>$k_g$ (k for the green pixel)>$k_r$ (k for the red pixel). Specifically, k can be increased by, for example, increasing the back-gate capacitance or decreasing the top-gate capacitance.

Variation Example 3

Figure 6:
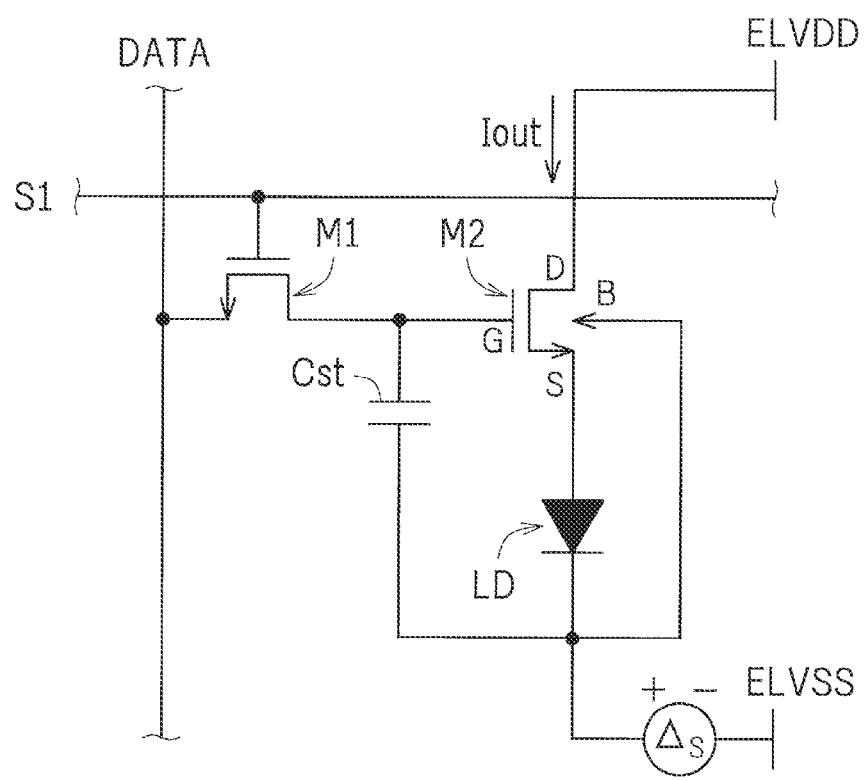
FIG. 6 is a circuit diagram of a pixel circuit in accordance with Variation Example 3.

The second terminal of the capacitor Cst is grounded in the structure shown in FIG. 1. In Variation Example 3, the second terminal of the capacitor Cst is connected to the cathode near the associated light-emitting element as shown in FIG. 6. Specifically, the first terminal of the capacitor Cst (shown on the bottom side of Cst in FIG. 6) is electrically connected to the second element electrode 15 via a contact hole provided inside the display area. This connection boosts up the first terminal of the capacitor Cst, that is, $V_G$, by $C\Delta_S$, where $0 \leq C \leq 1$, after a data signal is written to the drive transistor. The sensitivity to the variation of the cathode electrical potential is similarly calculated based on this, and we obtain the following equation:

$$\partial Iout/\partial \Delta_S = -(1-C)(g_m g_{ld})/g_{ld}+(1+k)g_m),$$

which indicates that the changes in the luminance caused by $\Delta_S$ are reduced in Variation Example 3.

The display device in accordance with the present embodiment may be any display panel that includes a display element. Display elements are classified into those display elements whose luminance and transmittance are controlled through electric current and those display elements whose luminance and transmittance are controlled through voltage. Examples of current-controlled display elements include LED display devices such as OLED (organic light-emitting diode) display devices including OLEDs (organic light-emitting diodes) and inorganic LED display devices including inorganic light-emitting diodes and QLED display devices including QLEDs (quantum-dot light-emitting diodes). Examples of voltage-controlled display elements include liquid crystal display elements.

The embodiments disclosed herein are for illustrative purposes only in every respect and provide no basis for restrictive interpretations. The scope of the disclosure is defined only by the claims and never bound by the specification. Those modifications and variations that may lead to equivalents of claimed elements are all included within the scope of the invention.

REFERENCE SIGNS LIST

3 Back-gate Electrode (Exemplary Second Gate Terminal)
5 Oxide Semiconductor Layer
7 Top-gate Electrode (Exemplary First Gate Terminal)
12a First Element Electrode
13 Light-emitting Layer
15 Second Element Electrode
CH Contact Hole
Cst Capacitor
LD Light-emitting Element
M1 Write Transistor
M2 Drive Transistor

The invention claimed is:

1. A display device comprising, in a display area, a matrix of subpixels and light-emitting elements, one for each of the subpixels, wherein
   the subpixels each including a subpixel circuit provided at an intersection of scan control lines and data signal lines intersecting with the scan control lines,
   the subpixel circuit includes a drive transistor, a write transistor, and a capacitor that retains a data signal,
   the write transistor includes a conduction terminal connected to an associated one of the data signal lines, another conduction terminal connected to a first gate terminal of the drive transistor, and a control terminal connected to an associated one of the scan control lines,
   each of the light-emitting elements includes a first element electrode, a light-emitting layer, and a second element electrode, the first element electrode being connected to a conduction terminal of the drive transistor,
   the drive transistor includes a second gate terminal connected to the second element electrode via a contact hole provided in the display area,
   a cathode and a back-gate electrode are electrically connected via the contact hole which is adjacent to an associated one of the light-emitting elements,
   the back-gate electrode is configured as the second gate terminal of the drive transistor of each of a plurality of pixel circuits,
   the contact hole is provided at one of the subpixels,
   the contact hole is provided commonly to an associated plurality of the subpixels,
   the plurality of subpixels comprises at least three or more subpixels that emit light of different colors,
   the plurality of subpixels comprises a first subpixel that emits light of a first color and a second subpixel that emits light of a second color that differs from the first color, and
   $g_{ld1}>g_{ld2}$ and $g_{m1}>g_{m2}$, where $g_{ld1}$ is a conductance of one of the light-emitting elements in the first subpixel, $g_{m1}$ is a mutual conductance of the first subpixel, $g_{ld2}$ is a conductance of one of the light-emitting elements in the second subpixel, and $g_{m2}$ is a mutual conductance of the second subpixel.

2. The display device according to claim 1, further comprising a top-gate electrode, the back-gate electrode and the top-gate electrode being provided on a substrate in order, wherein
   the top-gate electrode is the first gate terminal.

3. The display device according to claim 1, wherein the capacitor includes a terminal connected to the second element electrode via the contact hole provided in the display area.

4. The display device according to claim 1, wherein the drive transistor contains an oxide semiconductor layer.

5. The display device according to claim 1, wherein the plurality of pixel circuits are pixel circuits of each of RGB subpixels defining one pixel.

6. The display device according to claim 1, wherein the plurality of pixel circuits are pixel circuits of each of 100 or fewer subpixels.

7. A display device comprising, in a display area, a matrix of subpixels and light-emitting elements, one for each of the subpixels, wherein the subpixels each including a subpixel circuit provided at an intersection of scan control lines and data signal lines intersecting with the scan control lines, the subpixel circuit includes a drive transistor, a write transistor, and a capacitor that retains a data signal, the write transistor includes a conduction terminal connected to an associated one of the data signal lines, another conduction terminal connected to a first as to terminal of the drive transistor, and a control terminal connected to an associated one of the scan control lines, each of the light-emitting elements includes a first elements electrode, a light-emitting layer, and a second element electrode, the first element electrode being connected to a conduction terminal of the drive transistor, the drive transistor includes a second gate terminal connected to the second element electrode via a contact hole provided in the display area, a cathode and a back-gate electrode are electrically connected via the contact hole which is adjacent to an associated one of the light-emitting elements, the back-gate electrode is configured as the second gate terminal of the drive transistor of each of a plurality of pixel circuits, the contact hole is provided at one of the subpixels, the contact hole is provided commonly to an associated plurality of the subpixels, the plurality of subpixels comprises at least three or more subpixels that emit light of different colors, the plurality of subpixels comprises a first subpixel that emits light of a first color and a second subpixel that emits light of a second color that differs from the first color, and $g_{ld1} > g_{ld2}$ and $k_1 > k_2$, where $g_{ld1}$ is a conductance of one of the light-emitting elements in the first subpixel, $k_1$ is a capacitance ratio of the first subpixel, $g_{ld2}$ is a conductance of one of the light-emitting elements in the second subpixel, and $k_2$ is a capacitance ratio of the second subpixel.

8. The display device according to claim 7, further comprising:

a top-gate electrode, the back-gate electrode and the top-gate electrode being provided on a substrate in order, wherein the top-gate electrode is the first gate terminal.

9. The display device according to claim 7, wherein the capacitor includes a terminal connected to the second element electrode via the contact hole provided in the display area.

10. The display device according to claim 7, wherein the drive transistor contains an oxide semiconductor layer.

11. The display device according to claim 7, wherein the plurality of pixel circuits are pixel circuits of each of RGB subpixels defining one pixel.

12. The display device according to claim 7, wherein the plurality of pixel circuits are pixel circuits of each of 100 or fewer subpixels.

* * * * *